(12) United States Patent
Tekushan

(10) Patent No.: US 6,937,093 B2
(45) Date of Patent: Aug. 30, 2005

(54) CATHODE-COUPLED PENTODE VALVE AMPLIFIER WITH SERVO OFFSET CONTROLLED PUSH-PULL OUTPUT STAGE

(75) Inventor: Terence D. Tekushan, Cleveland, OH (US)

(73) Assignee: Bretza, Ltd., Cleveland, OH (US)

( * ) Notice: Subject to any disclaimer, the term of this patent is extended or adjusted under 35 U.S.C. 154(b) by 43 days.

(21) Appl. No.: 10/752,966

(22) Filed: Jan. 7, 2004

(65) Prior Publication Data

US 2004/0140850 A1 Jul. 22, 2004

Related U.S. Application Data

(60) Provisional application No. 60/438,688, filed on Jan. 8, 2003, and provisional application No. 60/499,773, filed on Sep. 3, 2002.

(51) Int. Cl.[7] ............................................. H03F 3/30
(52) U.S. Cl. ............................ 330/119; 330/3; 330/118
(58) Field of Search ..................... 341/3, 119, 121–123

(56) References Cited

U.S. PATENT DOCUMENTS 3,995,226 A * 11/1976 Berning ......................... 330/3
5,302,912 A * 4/1994 Grant ......................... 330/118
5,546,046 A * 8/1996 Trentino ..................... 330/127
6,140,870 A * 10/2000 Cook .......................... 330/118
6,507,240 B2 * 1/2003 Butler ............................. 330/3

* cited by examiner

*Primary Examiner*—Michael Tokar
*Assistant Examiner*—Linh V Nguyen
(74) *Attorney, Agent, or Firm*—Burns, Doane, Swecker & Mathis, L.L.P.

(57) ABSTRACT

An amplifier is described including a pair of cathode-coupled pentode vacuum tubes. A first pentode of the pair includes a control grid configured to receive an input signal. A second pentode of the pair includes a control grid configured to be coupled to an input reference signal. A cascaded voltage regulator includes a first stage configured to generate a plate reference voltage for providing voltage to a plate of each pentode. The regulator includes a second stage configured to generate a screen reference voltage based on the plate reference voltage for providing voltage to a screen grid of each pentode. The amplifier can also include a push-pull output stage having a servo circuit configured to adjust the control bias signal for one of a pair of vacuum tubes included in the stage until the plate currents in the pair of tubes are substantially equal.

19 Claims, 6 Drawing Sheets

CATHODE-COUPLED PENTODE VALVE AMPLIFIER WITH SERVO OFFSET CONTROLLED PUSH-PULL OUTPUT STAGE

RELATED APPLICATIONS

This application claims the benefit of U.S. Provisional Application No. 60/438,688, titled "Push-Pull Power Amplifier", filed on Jan. 8, 2003, and of U.S. Provisional Application No. 60/499,773, titled "Servo Offset Control of Power Tubes in a Push-Pull Amplifier", filed on Sep. 3, 2002, the entire contents of which are incorporated here by reference.

BACKGROUND

Vacuum tube (or valve) amplifiers have used cathode-coupled input stages to generate complementary output signals from a single-ended input signal. Such complementary output signals can be used to drive efficient push-pull output stages. Symmetry in the amplitude (and in the phase) of the complementary output signals has been shown to suffer unless unequal plate load resistors are employed. Mullard (of England) and Acrosound (Keroes Enterprises, of the United States) have utilized this technique with some degree of success.

In general, triode devices have been used to form cathode-coupled input pairs. However, the use of higher-gain pentode devices is desirable as these devices can allow a preferred voltage gain, phase inversion, and voltage drive to be achieved in a single amplifier stage. Achieving symmetry of the complementary output signals using unequal plate load resistors has been problematic with pentode-based cathode-coupled input stages. Also, symmetry has not been achieved using simple screen coupling through a capacitive network. Quad (of England) utilized a technique that takes a small portion of the signal from the "upper" tube in a cathode-coupled pair, and feeds the portion to the grid of the "lower" tube of the pair. This technique can affect both the bandwidth and maximum voltage swing of the stage, and can introduce distortion, generated in the upper tube, into the lower tube of the pair.

When driving push-pull output stages with complementary output signals, it is important that the net current flow through an output transformer coupled to the push-pull stage be zero. The net current flow is the difference between the currents flowing from the center tap of the transformer primary winding to each plate connection of the push-pull stage (or plate connection and screen tap in the case of Ultralinear transformers). Offset (or inequality) in these currents can create DC-induced magnetization of the transformer core.

Ideally, a transformer core maintains a neutral magnetic flux with variations created only by an AC (e.g., audio) signal passing through it. Unequal current flows from power tube plates of the push-pull stage to the center tap of the transformer can create a static flux, which can shift the intersection point of the core's B-H curve. This can result in increased harmonic distortion in the transformer, particularly at signal frequencies that approach the low frequency limits of the transformer or at signal levels that approach the power limits of the transformer.

SUMMARY

Accordingly, a cathode-coupled pentode valve amplifier with servo offset controlled push-pull output stage is described. According to an exemplary embodiment, an amplifier is described that includes a pair of cathode-coupled pentode vacuum tubes. A first pentode of the pair includes a control grid configured to receive an input signal. A second pentode of the pair includes a control grid configured to be coupled to an input reference signal. A cascaded voltage regulator is included having a first stage configured to generate a plate reference voltage for providing voltage to a plate of each pentode. The regulator includes a second stage configured to generate a screen reference voltage based on the plate reference voltage for providing voltage to a screen grid of each pentode. The amplifier can be configured to generate a pair of complementary output signals at the plates of the pentodes that are proportional to the input signal.

According to another exemplary embodiment, an amplifier is described including a pair of vacuum tubes, each vacuum tube having a control grid configured to receive a respective control bias signal. A grid bias circuit includes independent segments configured to generate the respective control bias signals. A servo circuit includes a pair of inputs, each input coupled to a cathode of a respective one of the vacuum tubes. An output of the servo is detachably coupled to one segment of the grid bias circuit. The servo circuit can be configured to adjust the control bias signal for one of the vacuum tubes until a plate current in the one vacuum tube is substantially equal to a plate current in the other vacuum tube.

According to yet another exemplary embodiment, an amplifier is described including a pair of cathode-coupled pentode vacuum tubes. A first pentode of the pair includes a control grid configured to receive an input signal. A second pentode of the pair includes a control grid configured to be coupled to an input reference signal. A cascaded voltage regulator includes a first stage configured to generate a plate reference voltage for providing voltage to a plate of each pentode. The regulator includes a second stage configured to generate a screen reference voltage based on the plate reference voltage for providing voltage to a screen grid of each pentode.

The amplifier also includes a second pair of vacuum tubes, each vacuum tube of the second pair having a control grid configured to receive a respective control bias signal and one of a pair of complementary output signals generated at the plates of the pentodes proportional to the input signal. A grid bias circuit having independent segments is configured to generate the respective control bias signals. The amplifier includes a servo circuit having a pair of inputs. Each input is coupled to a cathode of a respective one of the vacuum tubes of the second pair. An output of the servo circuit is detachably coupled to one segment of the grid bias circuit. The servo circuit can be configured to adjust the control bias signal for one of the vacuum tubes of the second pair until a plate current in the one vacuum tube is substantially equal to a plate current in the other vacuum tube of the second pair.

BRIEF DESCRIPTION OF THE DRAWINGS

The accompanying drawings provide visual representations which will be used to more fully describe the representative embodiments disclosed here and can be used by those skilled in the art to better understand them and their inherent advantages. In these drawings, like reference numerals identify corresponding elements, and.

DETAILED DESCRIPTION

Figure 1:
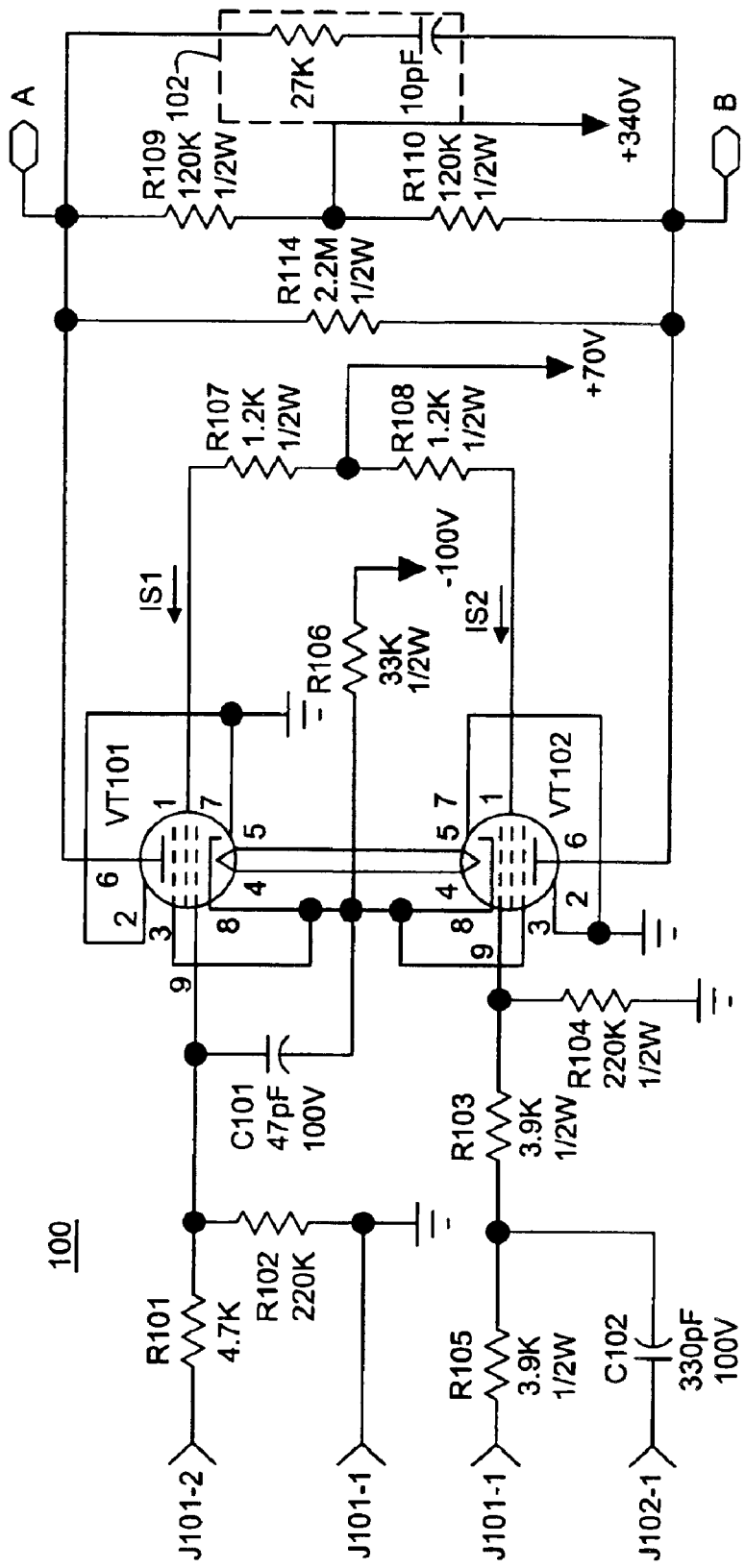
FIG. 1 illustrates an input stage of a valve amplifier having cathode-coupled pentode input values according to an exemplary embodiment.

FIG. 1 illustrates an input stage of a valve amplifier according to an exemplary embodiment. The input stage 100 includes a pair of cathode-coupled pentode vacuum tubes (tubes or valves), e.g., the vacuum tubes VT101, VT102. The pentodes are referred to as "cathode-coupled" because the cathodes 8 of the pentodes VT101, VT102 are connected to one another. The unique characteristics of the pentode vacuum tube allows the cathode-coupled pair to operate similar to a differential pair without requiring a constant current-source to draw current from the cathodes 8.

A first pentode VT101 of the pair includes a control grid 9 configured to receive an input signal, e.g. via input terminals J101-2,1. The input terminals can comprise a coaxial connection in which an input signal (e.g., an audio signal) and its reference (or ground) signal are introduced at the terminals J101-2,1, respectively. The input stage 100 can be configured to generate a pair of complementary output signals at the plates 6 of the pentodes VT101, VT102, that is proportional to the input signal. By complementary, it is meant that the output signals have substantially the same peak-to-peak value (e.g., within the tracking tolerances of pentodes VT101, VT102, screen grid resistors 107, 108, and plate resistors R109, R110), and are substantially 180° out-of-phase of one another (e.g., again within the tracking tolerances of the pentodes and screen and plate resistors).

A second pentode VT102 of the pair also includes a control grid 9 configured to be coupled to an input reference signal, e.g. via grid bias resistor R104. According to an exemplary embodiment, a portion of the input reference signal can be proportional to at least one of the pair of complementary output signals. For example, the input terminals J102-2,1 can be coupled to the secondary winding of the output transformer 308 (shown in FIG. 3), providing for negative feedback in the amplifier (referred to as "global negative feedback"). The feedback signal can be attenuated via the resistor divider between resistors R105, R103 and resistor R104.

The input stage 100 can include a pair of screen grid resistors, e.g., R107 and R108. Each screen grid resistor has a first terminal connected to a screen reference voltage, e.g., about +70 volts, and a second terminal connected to the screen grid 1 of a respective one of the pentodes VT101, VT102.

The screen grid resistors R107, R108 serve two purposes. First, the resistors aid in buffering the screen currents IS1, IS2, to account for variations between the pentodes VT101, VT102. Second, the screen grid resistors R107, R108 can bandwidth limit signals introduced at the screen grids 1 of the pentodes VT101, VT102. Bandwidth limiting above the audio spectrum can be desirable as the high-gain cathode-coupled pentodes VT101, VT102 can pass high frequency and RF noise, which can waste power and increase distortion in the pentode pair. Such noise and distortion can eventually be passed to the output transformer 308, and can causing parasitic oscillations at the resonant frequency of the transformer 308. An R-C network 102 can be coupled between the plates 6 of the pentodes VT101, VT102, to improve the bandwidth limiting provided by the screen grid resistors R107, R108.

The values of screen grid resistors R107, R108 can vary over a broad range depending on, among other things, the characteristics of the output transformer 308. In addition, too low a screen grid resistance value can make the pentode idle currents susceptible to tube variations. Too high a value can affect the symmetry of the outputs at the plates 6 of the pentodes VT101, VT102. According to an exemplary embodiment, the screen grid resistors R107, R108 can be substantially equal in value (within specified tolerances), e.g., about 1.2 K-ohm. Alternatively, the screen grid resistors can be unequal by an amount proportional to an amount of mismatch between the pair of complementary output signals at the plates of the pentodes. The mismatch can occur, among other reasons, as a result of mismatches in the characteristics of the pentodes VT101, VT102.

According to an exemplary embodiment, the input stage can also include a common cathode resistor R106 having a first terminal connected to the cathodes 8 of the pentodes VT101, VT102, and a second terminal connected to a cathode reference voltage, e.g., about −100 volts. The common cathode resistor R106 can be relatively large, e.g., 33 K-ohm, to maximize signal transfer between the cathode-coupled pentodes VT101, VT102. As discussed above, constant-current sources below the cathode resistor R106 are commonly employed in triode and solid-state circuits, but this function can be served by the unique constant current characteristics of the pentode vacuum tube.

The input stage 100 can also include a pair of substantially equal (e.g., about 120 K-ohm) plate resistors R109, R110. Each of the plate resistors R109, R110 has a first terminal connected to a plate reference voltage, e.g., about +340 volts, and a second terminal connected to the plate 6 of a respective one of the pentodes VT101, VT102. As discussed above, symmetry of the output signals at the plates of cathode-coupled triode vacuum tubes has been achieved with some degree of success by employing unequal plate resistors. However, using unequal plate resistors can cause impedance mismatches between the input and output stages of the amplifier, and has been problematic in producing output symmetry with high-gain pentode input devices.

Figure 2A:
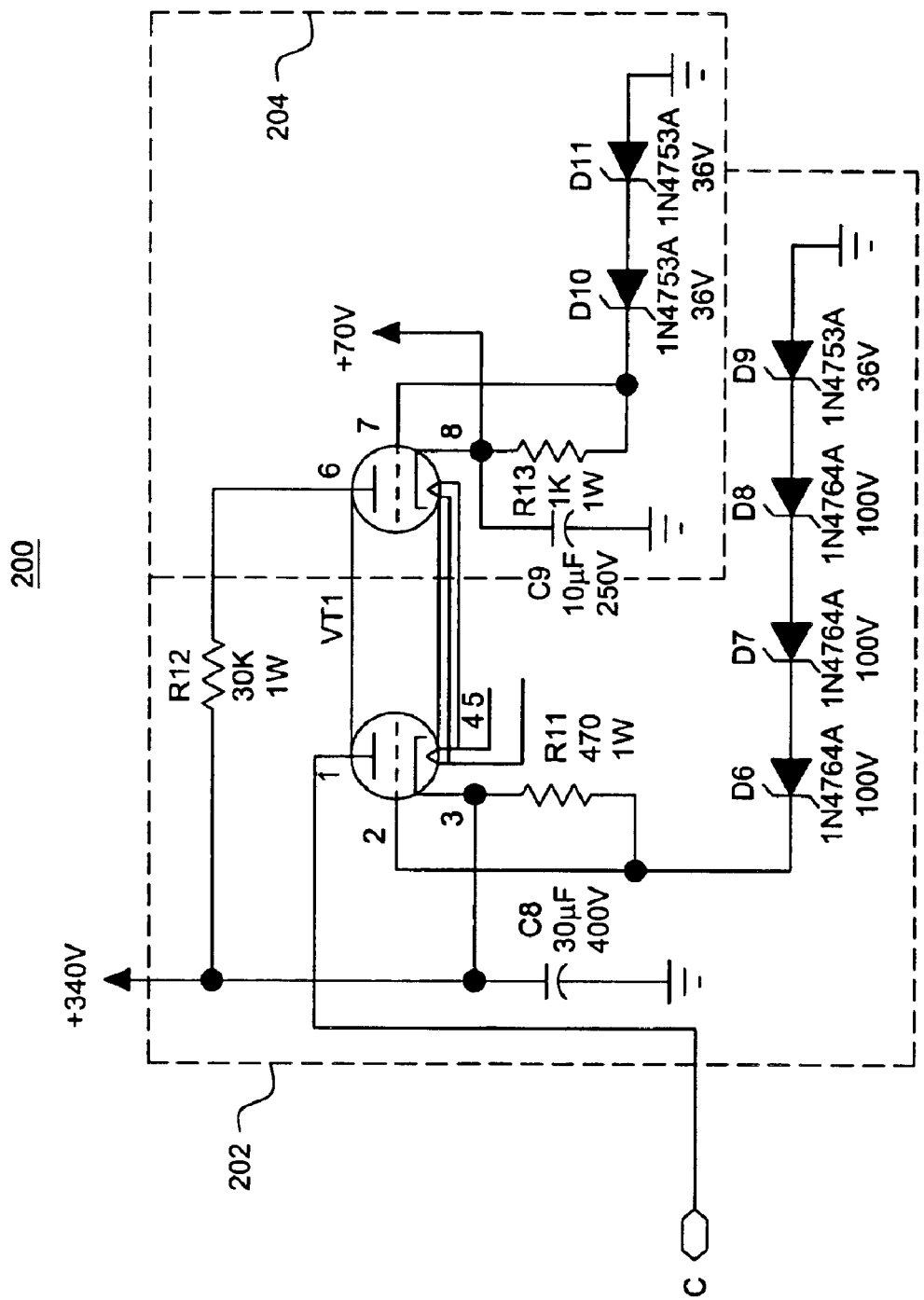
FIG. 2A and FIG. 2B illustrates an exemplary power supply including a cascaded voltage regulator for use with the amplifier shown in FIG. 1.
Figure 2B:
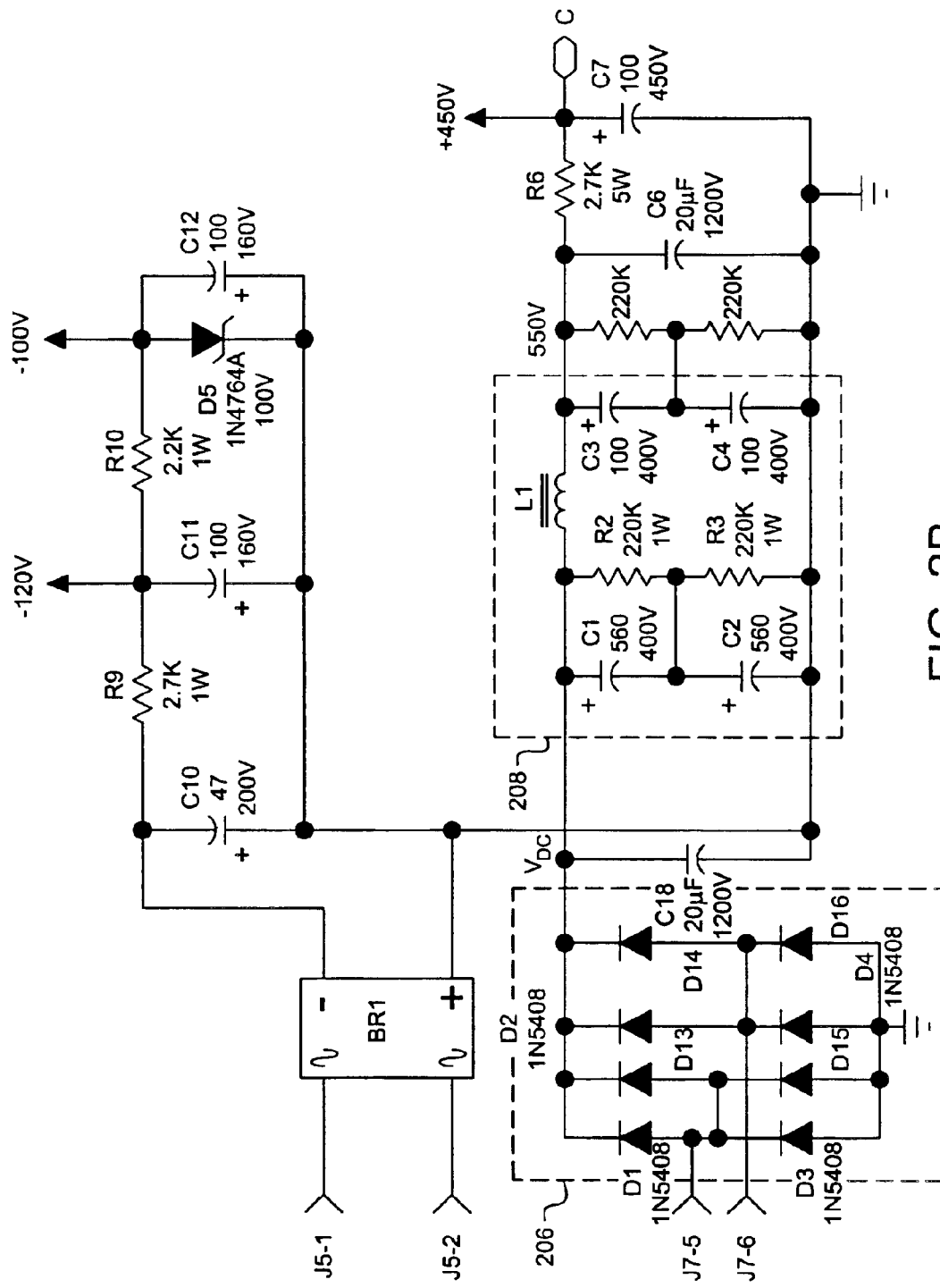

Symmetry can be achieved in the outputs of the amplifier stage shown in FIG. 1 through the use of the common, low-impedance, cascade voltage regulator 200 shown in FIG. 2. The cascaded voltage regulator 200 includes a first stage 202 configured to generate the plate reference voltage, e.g., about +340 volts, for providing voltage to the plate 6 of each pentode VT101, VT102. The regulator 200 includes and a second stage 204 configured to generate the screen reference voltage, e.g., about +70 volts, based on the plate reference voltage, for providing voltage to a screen grid 1 of each pentode VT101, VT102.

According to an exemplary embodiment, each stage of the cascaded voltage regulator 200 can include a resistor, e.g., R11, R13, having a first terminal connected to an output 3, 8 of the stage. Each stage can also include a diode, e.g. D6–D9, D10–D11, having a first terminal 2, 7, connected to a second terminal of the resistor R11, R13, and a second terminal connected to a ground reference. The diode can have a turn-on voltage related to the reference voltage generated by the stage. For example, the diodes D6–D9 and D10–D11 shown in FIG. 2 are Zener diodes, having turn-on voltages of about +336 volts and +72 volts, respectively. The turn-on voltages of the diodes in each of the stages can be chosen to be relatively near the desired reference voltages of the stages (e.g., +340 volts and +70 volts, respectively). In this manner, each diode turn-on voltage can be said to be "related to" the reference voltage generated by the stage. An additional voltage drop across the resistors R11, R13 determines the reference voltage for the stages.

Each stage of the regulator can also include a voltage regulating device, e.g., valves VT1, having an output terminal, e.g., cathodes 3, 8, connected to the output of the stage. The voltage regulating device can also include an input terminal, e.g., plates 1, 6, connected to an input reference voltage, and a control terminal, e.g., grids 2, 7, connected to a control bias reference, e.g., the turn-on voltages of the diodes D6–D9, D10–D11. The input reference voltage of the second stage can correspond to the plate reference voltage, e.g., about +340 volts, at the output of the first stage. The input voltage regulating device can be a high-transconductance triode vacuum tube, such as the dual-valve triode (e.g., type 6DJ8 or 6922) VT1 shown in FIG. 2. Alternatively, solid-state devices can be used for the voltage regulating devices.

According to an exemplary embodiment, the cascaded voltage regulator can also include a transformer (not shown) having a primary winding connected to an AC line voltage (not shown) and secondary winding configured to generate an AC reference voltage proportional to the AC line voltage. The use of such step-up and step-down transformers is well known to those skilled in the art, and need not be shown in the figures or further discussed in detail. The regulator can also include a bridge-rectifier circuit 206 coupled to the secondary winding of the transformer, e.g., via input terminals J7-5,6, for generating a DC reference voltage, $V_{DC}$.

A filter network 208 coupled to the bridge-rectifier circuit 206 can be included in the regulator for generating a filtered DC reference voltage, e.g., about +450 volts. For example, FIG. 2 includes an L-C capacitor-input filter including inductor L1 and capacitors C1–C4. The input reference voltage of the first stage can corresponds to the filtered DC reference voltage, e.g., +450 volts, at the output of the filter network 208 (note also the additional optional step-down resistor R6). The cascaded voltage regulator can also be configured to generate the cathode reference voltage, e.g., via diode D5.

Figure 3:
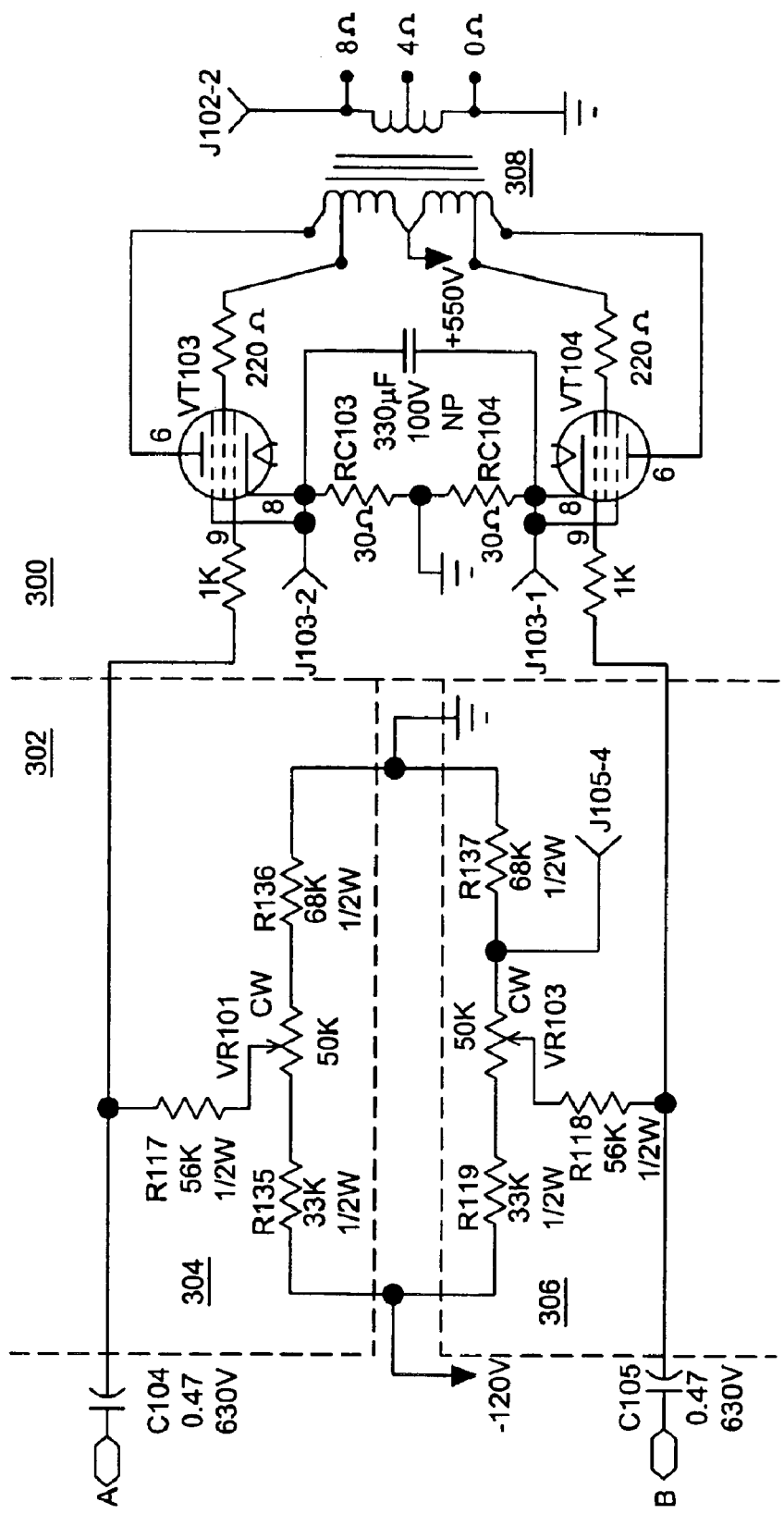
FIG. 3 illustrates a push-pull output stage for the valve amplifier according to an exemplary embodiment.

FIG. 3 illustrates a push-pull output stage 300 for the valve amplifier according to an exemplary embodiment. The push-pull stage 300 includes a pair of vacuum tubes VT103, VT104. The vacuum tubes VT103, VT104 can be pentodes of the type EL34 or 6CA7, or any suitable power tube, triode, power-pentode, or beam power tube. Each vacuum tube VT103, VT104 has a control grid 9 configured to receive a respective control bias signal. Each control grid 9 is further configured to receive a respective one of the pair of complementary output signals. For example, the control grids 9 of the valves VT103, VT104 can be coupled to the plates 6 of the pentodes VT101, VT102, via decoupling capacitors C104, C105.

The amplifier also includes a grid bias circuit 302 having independent segments 304, 306, configured to generate the respective control bias signals. Each segment 304, 306 of the grid bias circuit 302 includes a tapped resistor, e.g., VR101, VR103, having a first variable resistor coupled between a first grid reference voltage, e.g., -120 volts, and a variable center tap of the tapped resistor (indicated by the arrows in drawing). In the exemplary circuit shown in FIG. 3, the first variable resistor includes fixed 33 K-ohm resistors R119, R135, and a first variable portion of the 50 K-ohm tapped resistors VR101, VR103. A second variable resistor is coupled between the center tap and a second grid reference voltage, e.g., the ground reference. In the figure, the second variable resistor includes fixed 68 K-ohm resistors R136, R137, and a second variable portion of the 50 K-ohm tapped resistors VR101, VR103. The control bias signal generated by each segment 304, 306 is proportional to a voltage at the center tap of each tapped resistor VR101, VR103.

Figure 4A:
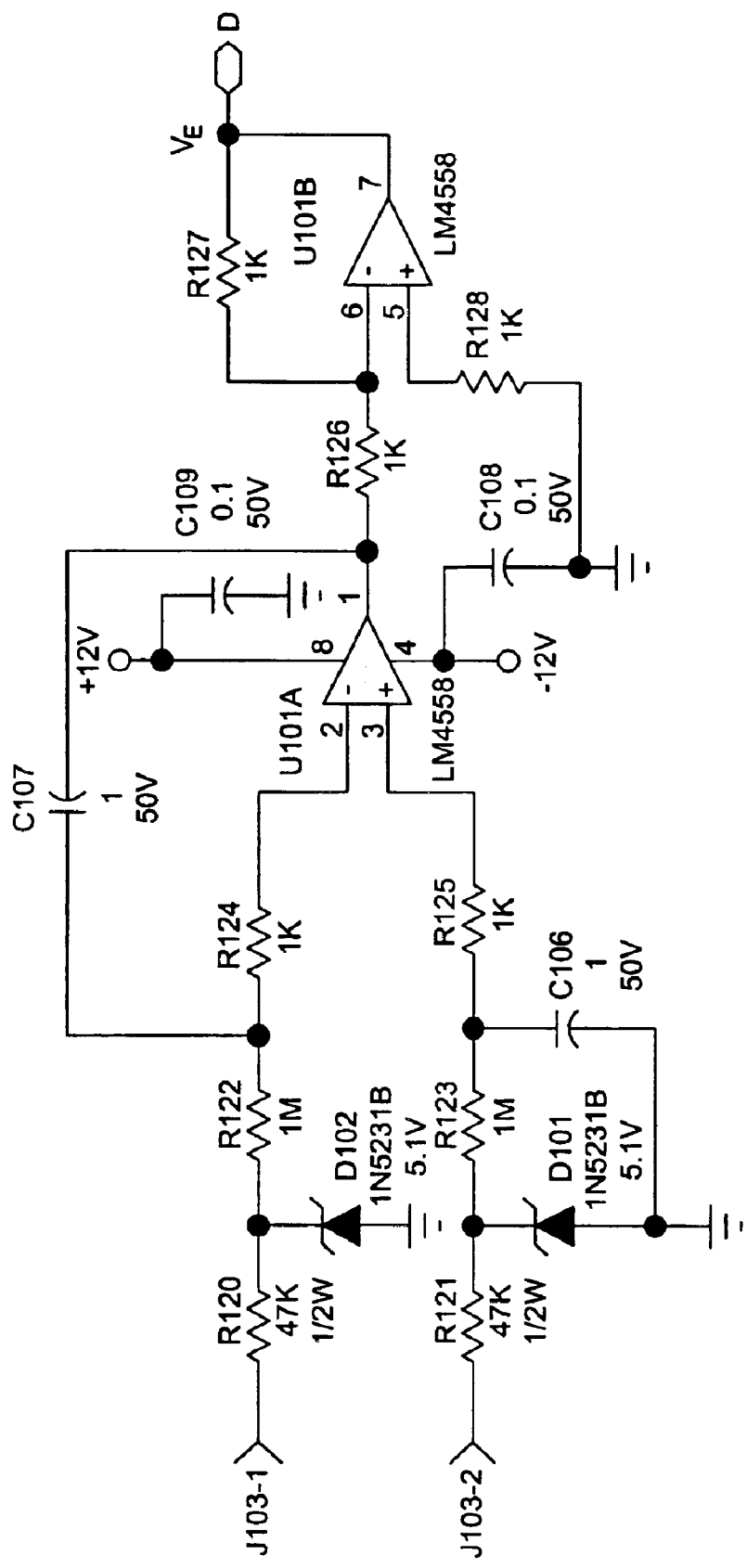
FIGS. 4A and 4B illustrates a servo circuit for controlling an offset current in the push-pull output stage shown in FIG. 3.
Figure 4B:
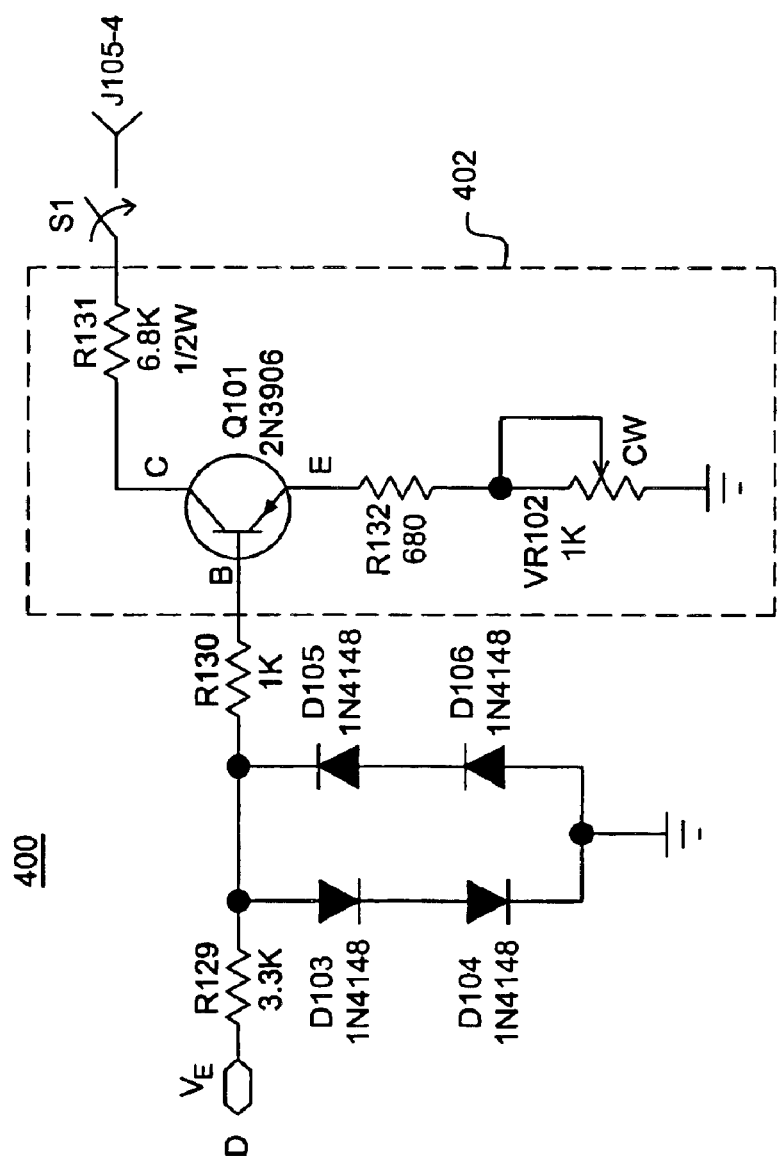

FIG. 4 illustrates a servo circuit 400 for controlling an offset current in the push-pull output stage 300 shown in FIG. 3. The servo circuit 400 includes a pair of inputs, e.g., input terminals J103-2,1. Each input J103-2,1 is coupled to a cathode 8 of a respective one of the vacuum tubes VT103, VT104. An output of the servo circuit, e.g., output terminal J105-4, is detachably coupled, e.g., via switch S1, to one segment, e.g. segment 306, of the grid bias circuit 302. The servo circuit can be configured to adjust the control bias signal for one of the vacuum tubes, e.g., valve VT104, until a plate current in the one vacuum tube VT104 is substantially equal to a plate current in the other vacuum tube VT103.

According to an exemplary embodiment, the servo circuit 400 includes a difference amplifier, e.g., U101A, U101B having a pair of inputs 3, 2 corresponding to the pair of servo circuit inputs, J103-2,1. The difference amplifier includes an output 7 configured to generate an error signal $V_E$ proportional to a difference of cathode voltages of the vacuum tubes V103, V104. As shown in FIG. 3, a pair of substantially equal cathode resistors RC103, RC104 (e.g., each 30 ohms within tolerances of the resistors) can be included in the push-pull output stage 300. Each cathode resistor RC103, RC104 has a first terminal connected to a cathode reference voltage, e.g., the ground reference, and a second terminal connected to the cathode 8 of a respective one of the vacuum tubes VT103, VT104. The cathode voltage of each vacuum tube VT103, VT104 can correspond to a voltage drop across a respective one of the cathode resistors RC103, RC104.

Referring again to FIG. 4, the servo circuit 400 can also include a variable current shunt 402 having a control input, e.g., the base B of the PNP transistor Q101, coupled to the output 7 of the difference amplifier U101A, U101B. The current shunt 402 can also include an output J105-4 that is detachably coupled, e.g., via S1, to the second variable resistor of the one grid bias circuit segment 306 at a terminal J105-4 opposite the center tap. The output of the variable current shunt corresponds to the output of the servo circuit and is configured to draw current through the first and second variable resistors, corresponding to the tapped resistor, e.g., VR103, of the one grid bias circuit segment 306 in an amount proportional to the error signal $V_E$ to adjust the control bias signal of the one vacuum tube VT104.

The following example summarizes the operation of the servo circuit 400. Assume that the plate current in valve VT103 changes to be greater than the plate current in valve VT104. Such an arrangement will result in the cathode current in valve VT103 to be greater than the cathode current in valve VT104 by nearly the same amount as the difference in the corresponding plate currents. The different cathode currents flowing through the valves will generate a positive differential voltage across the cathode resistors RC103 and RC104 that is proportional to amount of change in the plate currents.

The positive differential voltage presented at the input terminals 3, 2 of the operational amplifier U101A will be amplified and inverted, resulting in a negative-going voltage at the output terminal 1 of the amplifier U101A. In the exemplary circuit shown in FIG. 4, the output terminal 1 of the operational amplifier U101A is coupled to an inverting terminal 6 of a second operational amplifier U101B, resulting in a positive-going error signal $V_E$ at the output terminal 7 of the second operational amplifier U101B. Operational amplifiers U101A and U101B form the difference amplifier of the servo circuit 400.

The positive-going error signal $V_E$ causes the base-collector bias $V_{BC}$ for the PNP transistor Q101 of the current shunt 402 to expand, resulting in an increased shunting collector current $I_C$ flowing though the transistor Q101. This, in turn, increases a shunting current flowing through the tapped resistor VR103, causing the voltage at the center tap of the resistor VR103 (e.g., the control bias for VT104) to rise. The rising control bias coupled to the grid 9 of VT104 causes the plate current in the valve to increase to match the increased plate current in VT103. This, in turn, causes the cathode voltage across RC104 to increase, reducing the differential voltage present at the inputs of the servo circuit 400. Adjustment of the control bias signal will continue until the plate current in valve VT104 is substantially equal to the plate current in valve VT103.

As will be understood by those skilled in the art, the substantiality of equality of the plate currents that can be achieved depends, among other things, on the gain of the servo feedback network, and the tolerance of the components that comprise the servo feedback network. It will be noted that the inputs of both the difference amplifier U101A, U101B and the current shunt 402 can be protected with current limiting and voltage protection networks, such as those formed by R120 and D102, R121 and D101, and the diode network D103–D106, as shown in FIG. 4.

According to an exemplary embodiment, the tapped resistor VR103 of the one grid bias circuit segment 306 is configured to generate a control bias signal corresponding to a near-cutoff plate current in the one vacuum tube VT104 when the output of the servo circuit 400 is detached, e.g., via S1, from the one grid bias circuit segment 306. Reducing the plate current in the one vacuum tube VT104 to a near-cutoff value when the servo circuit 400 is disconnected can maximize the range of plate currents that can be realized in the one vacuum tube VT104 when under servo control. This range can depend, among other things, on the nominal plate current of the other vacuum tube VT103 as determined by the setting of the tapped resistor VR101. Adjusting VR103 in this manner can also aid in achieve "lock" in the feedback network (e.g., near-zero offset current) in a timely and efficient manner.

It can be advantageous to have symmetrical grid bias circuit segments 304, 306 for generating the respective control bias signals as shown in FIG. 3. Doing so can allow the amplifier to be operated without servo control, e.g., in the event of a servo circuit 400 failure, by adjusting the bias provided to each vacuum tube VT103, VT104 independently using the tapped resistors VR101, VR103. Moreover, such a symmetrical arrangement can allow the servo circuit 400 to be directly applied to any vacuum tube amplifier having separate bias controls for each tube or tubes in a push-pull pair. The arrangement is also appropriate for the control of offset appearing at the speaker terminal of directly-coupled output, transformerless vacuum tube amplifiers.

It will be appreciated by those of ordinary skill in the art that the concepts and techniques described here can be embodied in various specific forms without departing from the essential characteristics thereof. The presently disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. An amplifier, comprising:
    a pair of cathode-coupled pentode vacuum tubes, a first pentode of the pair having a control grid configured to receive an input signal, and a second pentode of the pair having a control grid configured to be coupled to an input reference signal; and
    a cascaded voltage regulator having a first stage configured to generate a plate reference voltage for providing voltage to a plate of each pentode, and a second stage configured to generate a screen reference voltage based on the plate reference voltage for providing voltage to a screen grid of each pentode, wherein the amplifier can be configured to generate a pair of complementary output signals at the plates of the pentodes proportional to the input signal; a pair of screen grid resistors, each screen grid resistor having a first terminal connected to the screen reference voltage and a second terminal connected to the screen grid of a respective one of the pentode.

2. The amplifier of claim 1, wherein the screen grid resistors are unequal by an amount proportional to an amount of mismatch between the pair of complementary output signals at the plates of the pentodes.

3. The amplifier of claim 1, comprising:
    an R-C network coupled between the plates of the pentodes.

4. The amplifier of claim 1, comprising:
    a common cathode resistor having a first terminal connected to the cathodes of the pentodes and a second terminal connected to a cathode reference voltage.

5. The amplifier of claim 4, wherein the cascaded voltage regulator is configured to generate the cathode reference voltage.

6. The amplifier of claim 1, wherein a portion of the input reference signal is proportional to at least one of the pair of complementary output signals.

7. The amplifier of claim 1, comprising:
    a pair of substantially equal plate resistors, each plate resistor having a first terminal connected to the plate reference voltage and a second terminal connected to the plate of a respective one of the pentodes.

8. The amplifier of claim 1, each stage of the cascaded voltage regulator comprising:
    a resistor having a first terminal connected to an output of the stage;
    a diode having a first terminal connected to a second terminal of the resistor and a second terminal connected to a ground reference, the diode having a turn-on voltage related to the reference voltage generated by the stage; and
    a voltage regulating device having an output terminal connected to the output of the stage, an input terminal connected to an input reference voltage, and a control terminal connected to a control bias reference, wherein the input reference voltage of the second stage corresponds to the plate reference voltage at the output of the first stage.

9. The amplifier of claim 8, the cascaded voltage regulator comprising:
    a transformer having a primary winding connected to an AC line voltage and secondary winding configured to generate an AC reference voltage proportional to the AC line voltage;
    a bridge-rectifier circuit coupled to the secondary winding of the transformer for generating a DC reference voltage; and a filter network coupled to the bridge-rectifier circuit for generating a filtered DC reference voltage, wherein the input reference voltage of the first stage corresponds to the filtered DC reference voltage.

10. An amplifier, comprising:

a pair of vacuum tubes, each vacuum tube having a control grid configured to receive a respective control bias signal;

a grid bias circuit having independent segments configured to generate the respective control bias signals; and a servo circuit having a pair of inputs, each input coupled to a cathode of a respective one of the vacuum tubes, and an output detachably coupled to one segment of the grid bias circuit, wherein the servo circuit can be configured to adjust the control bias signal for one of the vacuum tubes until a plate current in the one vacuum tube is substantially equal to a plate current in the other vacuum tube.

11. The amplifier of claim 10, the servo circuit comprising:

a difference amplifier having a pair of inputs corresponding to the pair of servo circuit inputs, and an output configured to generate an error signal proportional to a difference of cathode voltages of the vacuum tubes, the error signal is used to adjust the control bias signal of the one vacuum tube.

12. The amplifier of claim 11, comprising:

a pair of substantially equal cathode resistors, each cathode resistor having a first terminal connected to a cathode reference voltage and a second terminal connected to the cathode of a respective one of the vacuum tubes, wherein the cathode voltage of each vacuum tube corresponds to a voltage drop across a respective one of the cathode resistors.

13. The amplifier of claim 10, each segment of the grid bias circuit comprising:

a tapped resistor having a first variable resistor coupled between a first grid reference voltage and a variable center tap of the tapped resistor, and a second variable resistor coupled between the center tap and a second grid reference voltage, wherein the respective control bias signal generated by each segment is proportional to a voltage at the center tap of each tapped resistor.

14. The amplifier of claim 13, the servo circuit comprising:

a difference amplifier having a pair of inputs corresponding to the pair of servo circuit inputs, and an output configured to generate an error signal proportional to a difference of cathode voltages of the vacuum tubes; and a variable current shunt having a control input coupled to the output of the difference amplifier, and an output detachably coupled to the second variable resistor of the one grid bias circuit segment at a terminal opposite the center tap, wherein the output of the variable current shunt corresponds to the output of the servo circuit and is configured to draw current through the first and second variable resistors of the one grid bias circuit segment in an amount proportional to the error signal to adjust the control bias signal of the one vacuum tube.

15. The amplifier of claim 13, wherein the tapped resistor of the one grid bias circuit segment is configured to generate a control bias signal corresponding to a near-cutoff plate current in the one vacuum tube when the output of the servo circuit is detached from the one grid bias circuit segment.

16. The amplifier of claim 10, wherein each control grid is configured to receive one of a complementary pair of audio signals.

17. The amplifier of claim 10, wherein a plate of each vacuum tube is coupled to a respective end of a primary winding of an audio output transformer.

18. The amplifier of claim 10, wherein a plate of each vacuum tube is coupled to a respective terminal of a speaker.

19. An amplifier, comprising:

a pair of cathode-coupled pentode vacuum tubes, a first pentode of the pair having a control grid configured to receive an input signal, and a second pentode of the pair having a control grid configured to be coupled to an input reference signal;

a cascaded voltage regulator having a first stage configured to generate a plate reference voltage for providing voltage to a plate of each pentode, and a second stage configured to generate a screen reference voltage based on the plate reference voltage for providing voltage to a screen grid of each pentode;

a second pair of vacuum tubes, each vacuum tube of the second pair having a control grid configured to receive a respective control bias signal and one of a pair of complementary output signals generated at the plates of the pentodes proportional to the input signal;

a grid bias circuit having independent segments configured to generate the respective control bias signals; and a servo circuit having a pair of inputs, each input coupled to a cathode of a respective one of the vacuum tubes of the second pair, and an output detachably coupled to one segment of the grid bias circuit, wherein the servo circuit can be configured to adjust the control bias signal for one of the vacuum tubes of the second pair until a plate current in the one vacuum tube is substantially equal to a plate current in the other vacuum tube of the second pair.

* * * * *